United States Patent [19]

Zivny

[11] Patent Number: 5,268,851
[45] Date of Patent: Dec. 7, 1993

[54] DETECTION OF METASTABILITY IN TRIGGERS

[75] Inventor: Pavel R. Zivny, Portland, Oreg.
[73] Assignee: Tektronix, Inc., Wilsonville, Oreg.
[21] Appl. No.: 780,174
[22] Filed: Oct. 21, 1991
[51] Int. Cl.⁵ .............................................. G01R 13/32
[52] U.S. Cl. ..................................... 364/481; 328/196
[58] Field of Search ............... 364/481, 486, 487; 324/76.11–77.11; 328/196; 395/375, 400, 550

[56] References Cited

U.S. PATENT DOCUMENTS

| | | | |
|---|---|---|---|
| 4,251,754 | 2/1981 | Navarro et al. | 315/370 |
| 4,647,862 | 3/1987 | Blair | 364/487 |
| 5,004,933 | 4/1991 | Widener | 307/269 |
| 5,014,226 | 5/1991 | Horstmann et al. | 364/489 |
| 5,122,694 | 6/1992 | Bradford et al. | 307/480 |
| 5,123,034 | 6/1992 | Grujon | 364/487 |

Primary Examiner—Thomas G. Black
Assistant Examiner—Michael Zanelli
Attorney, Agent, or Firm—Francis I. Gray; Boulden G. Griffith

[57] ABSTRACT

A method of detection of metastability of a trigger in a digital storage oscilloscope compares a predetermined address used to produce a trigger ready signal with a current address determined by the occurrence of a trigger event after the trigger ready signal. If the difference between the two addresses is within a predetermined limit, a metastable condition is indicated, and data acquired is treated as corrupted data.

4 Claims, 2 Drawing Sheets

DETECTION OF METASTABILITY IN TRIGGERS

BACKGROUND OF THE INVENTION

The present invention relates to the acquisition of data by a digital storage oscilloscope, and more particularly to a method and apparatus for the detection of metastability in triggers that reduces the amount of hardware necessary.

Due to the setup and hold time of latches and flip-flops there is a brief period when there is uncertainty in the transfer of data through such devices. This period is referred to as a metastable region. In a digital oscilloscope such uncertainty in the occurrence of a trigger may result, especially at small time scales on the order of nanoseconds, in a blurring or jitter in the acquired data when displayed. Attempts to eliminate metastability have been hardware intensive, generally requiring the addition of more latches/flip-flops to resolve any uncertainty. One such hardware solution is shown in U.S. Pat. No. 5,004,933, issued Apr. 2, 1991 to Glenn F. Widener entitled "Phase-Selectable Flip-Flop." Such additional hardware adds to the expense of a trigger circuit.

What is desired is a detection of metastability in triggers that eliminates the need for additional hardware while assuring that data affected by trigger metastability is identified.

SUMMARY OF THE INVENTION

Accordingly the present invention provides a detection of metastability in triggers that uses a microprocessor to determine whether trigger instability exists. The microprocessor initializes an address value for an address generator that determines when a trigger will be accepted. When the address generator attains the address value, a trigger ready signal is sent to a trigger flip-flop. A trigger signal clocks the trigger ready signal into the flip-flop, and the address from the address generator when the trigger signal is latched in the trigger flip-flop is stored. At the completion of the data acquisition and before further processing or display of the acquired data, the microprocessor compares the trigger occurrence address with the initial address value. If the difference in addresses is less than a predetermined value, and the time scale selected for display is such that uncertainty in the trigger may result in a blurring or jitter in the displayed data, then the microprocessor treats the acquired data as possibly being corrupted and proceeds to a new acquisition cycle.

The objects, advantages and other novel features of the present invention are apparent from the following detailed description when read in conjunction with the appended claims and attached drawing.

DESCRIPTION OF THE PREFERRED EMBODIMENT

Figure 1:
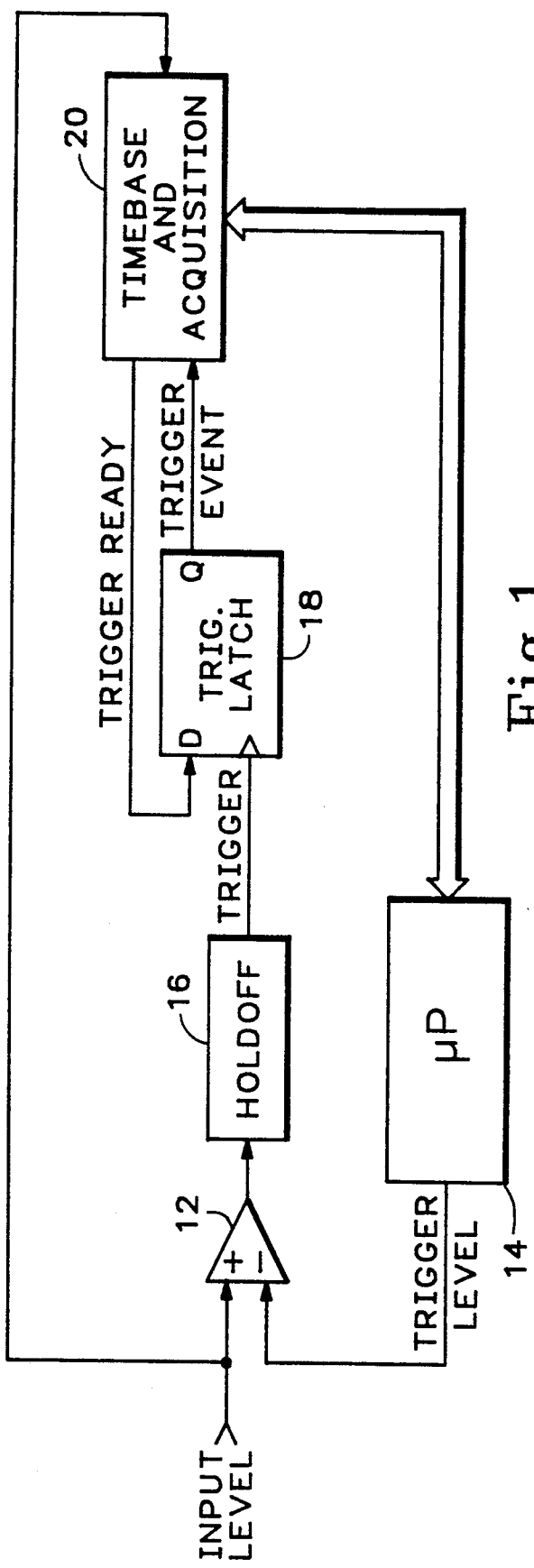
FIG. 1 is a block diagram of an acquisition section for a digital storage oscilloscope according to the present invention.

Referring now to FIG. 1 an input signal is input to a trigger comparator 12 together with a trigger level signal from a microprocessor 14. The output from the trigger comparator 12 is a series of pulses that occur every time the input signal exceeds the trigger level signal. The pulses are input to a holdoff circuit 16 that serves to reduce the number of trigger pulses passed so that there is a specified minimum time interval between them. The trigger pulses are input to a trigger latch 18 as a clock input. A timebase and acquisition circuit 20 receives the input signal, digitizes it and stores it in an acquisition memory. The timebase and acquisition circuit 20 also generates a trigger ready signal that is applied to the D-input of the trigger latch 18. The Q-output of the trigger latch 18 is a trigger event signal that is used to "freeze" the acquisition of data from the input signal after a predetermined time interval, or number of data samples. This allows for pre-trigger, post-trigger and intermediate-trigger acquisitions, as is well known in the art.

The metastability of the trigger event signal results when the trigger ready signal occurs very close in time to the trigger pulse at the clock input of the trigger latch 18. There is then an uncertainty as to exactly when the trigger ready signal occurred with respect to the trigger pulse, and thus for a repetitive signal a shifted set of data samples may be obtained. Thus when the data samples are displayed, the resulting waveform for the input signal is blurred or displays jitter.

Figure 2:
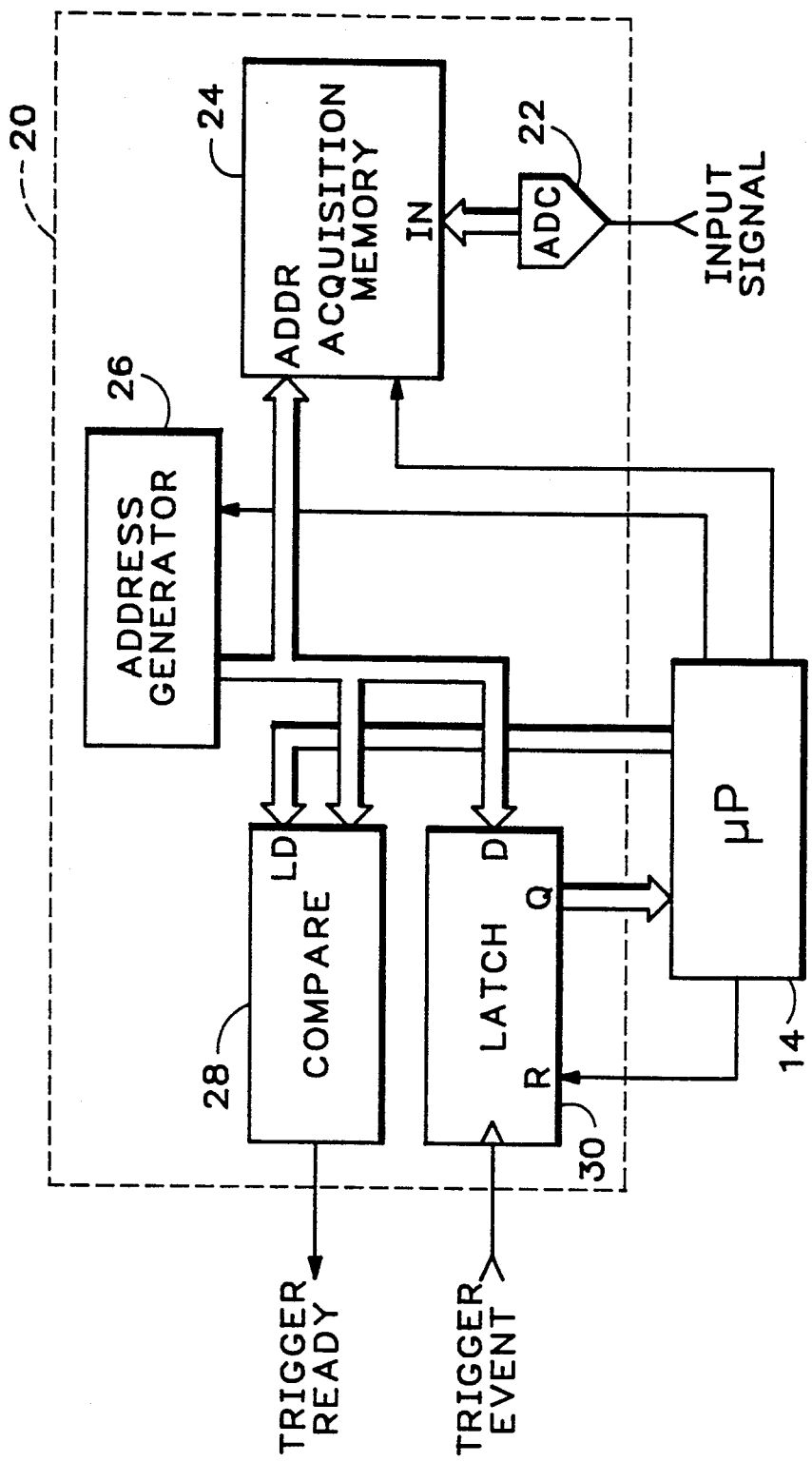
FIG. 2 is a block diagram of a timing section for the acquisition section of FIG. 1.

As shown in FIG. 2 the input signal is digitized by an analog-to-digital (ADC) converter 22. The digitized data samples are input to an acquisition memory 24 and stored at addresses determined by an address generator 26. The acquisition memory 24 is typically a circular memory so that, once the memory is full, new data samples overwrite old data samples. This process continues until a trigger event "freezes" the contents of the acquisition memory 24 so no further input data samples are accepted until processing of the "frozen" data by the microprocessor 14 is complete.

The microprocessor 14 is coupled to a trigger ready comparator 28. Also coupled to the trigger ready comparator 28 is the address generator 26. The microprocessor 14 loads a trigger address into the trigger ready comparator 28 so that when the address from the address generator 26 equals the trigger address, the trigger ready signal is output to the trigger latch 18. Also coupled to the microprocessor 14 and the address generator 26 is a trigger address latch 30. When the trigger event signal is generated by the trigger latch 18, the trigger event signal causes the current address from the address generator 26 to be latched into the trigger address latch 30. The microprocessor 14 at the conclusion of the acquisition cycle reads the address from the address trigger latch 30 for comparison with the address loaded into the trigger ready comparator 28.

In operation the microprocessor 14 sets the trigger ready address, either by loading the address value into the trigger ready comparator 28 as described above, or by presetting an initial address in the address generator 26 with the trigger ready comparator having a fixed address value, such as zero. The microprocessor also resets all the latches and sets the holdoff period. The microprocessor then starts an acquisition sequence by enabling the acquisition memory 24 and starting the address generator 26. As the data samples from the input signal are stored in the acquisition memory 24 as described above, the trigger ready signal is generated after which the trigger address latch 30 waits for a trigger event signal. Once a trigger event signal is received, acquisition is completed according to the trigger mode selected—pre-trigger, post-trigger or intermediate-trigger. If the time scale selected for display is such that metastability in the trigger signal would cause blurring or jitter of the displayed data samples, then the microprocessor 14 determines the difference between the trigger ready address and the trigger event address from the trigger address latch 30. If the difference is within a predetermined limit, such as +/− one or two addresses, then the acquired data is considered to be possibly corrupted by a metastability and the data is treated accordingly, such as by discarding the data and initiating a new acquisition cycle. Otherwise the data is processed as valid data and displayed before the cycle is started again.

Thus the present invention provides detection of metastability of a trigger signal without the use of additional hardware by comparing a data address when the acquisition system is ready to accept a trigger signal with the address when a trigger event occurs, and discarding or otherwise appropriately processing the acquired data when the address difference is within a predetermined limit indicative of a possible metastable condition.

What is claimed is:

1. A method of detection of metastability in a trigger signal comprising the steps of:
   comparing an address from an address generator with a predetermined address to produce a trigger ready signal;
   latching a current address of the address generator when a trigger signal occurs subsequent to the trigger ready signal; and
   indicating a possible metastable condition when the difference between the current and predetermined addresses is within a predetermined limit.

2. The detection method as recited in claim 1 further comprising the step of storing the predetermined address value in a comparator for comparison with the address from the address generator in the comparing step to produce the trigger ready signal.

3. The detection method as recited in claim 1 further comprising the step of offsetting a start address for the address generator corresponding to the predetermined address for comparison of the address from the address generator with a fixed value in a comparator in the comparing step to produce the trigger ready signal.

4. The detection method as recited in claim 1 further comprising the step of processing data acquired in response to the trigger signal according to the result of the indicating step.

* * * * *